(12) United States Patent
Gu

(10) Patent No.: US 11,901,009 B2
(45) Date of Patent: Feb. 13, 2024

(54) ADDRESS DECODING CIRCUIT, MEMORY, AND CONTROL METHOD

(71) Applicant: CHANGXIN MEMORY TECHNOLOGIES, INC., Hefei (CN)

(72) Inventor: Yinchuan Gu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 145 days.

(21) Appl. No.: 17/663,658

(22) Filed: May 16, 2022

(65) Prior Publication Data

US 2023/0221880 A1     Jul. 13, 2023

(30) Foreign Application Priority Data

Jan. 13, 2022   (CN) .......................... 202210039196.X

(51) Int. Cl.
*G11C 8/00*      (2006.01)
*G11C 16/08*     (2006.01)
*G06F 3/06*      (2006.01)
*G11C 8/10*      (2006.01)

(52) U.S. Cl.
CPC ............ *G11C 16/08* (2013.01); *G06F 3/0604* (2013.01); *G11C 8/10* (2013.01)

(58) Field of Classification Search
CPC .......... G11C 16/08; G11C 8/10; G08F 3/0604
USPC ................................................ 365/230.06
See application file for complete search history.

(56) References Cited

U.S. PATENT DOCUMENTS

| 8,923,090 | B1 | 12/2014 | Evans | |
|---|---|---|---|---|
| 2012/0106286 | A1* | 5/2012 | Lee | G11C 8/10 365/230.06 |
| 2015/0187406 | A1* | 7/2015 | Kim | G11C 11/4076 365/194 |

FOREIGN PATENT DOCUMENTS

| CN | 1985329 A | 6/2007 |
|---|---|---|
| CN | 109961822 A | 7/2019 |
| CN | 112634960 A | 4/2021 |
| CN | 113254359 A | 8/2021 |
| TW | 202009945 A | 3/2020 |

OTHER PUBLICATIONS

First Office Action of the Taiwanese application No. 111126478, dated May 31, 2023. 7 pages with English abstract.

* cited by examiner

*Primary Examiner* — Vu A Le
(74) *Attorney, Agent, or Firm* — Syncoda LLC; Feng Ma

(57) ABSTRACT

An address decoding circuit includes a decoding unit corresponding to a bank group and including first NAND gates, an address selection signal outputted by each first NAND gate controls a corresponding bank in the bank group corresponding to the decoding unit. The first NAND gate includes a first input end connected to an address signal of a bank corresponding to the first NAND gate and a second input end connected to an output end of a second NAND gate or a third NAND gate, the second NAND gate includes a first input end connected to an enable signal and a second input end connected to a control signal, and the third NAND gate includes a first input end connected to the enable signal and a second input end connected to an inverted signal of the control signal.

14 Claims, 13 Drawing Sheets

| BG0 | | BG1 | | BG2 | | BG3 | | BG4 | | BG5 | | BG6 | | BG7 | |
|-----|-----|-----|-----|-----|-----|-----|-----|-----|-----|-----|-----|-----|-----|-----|-----|
| BA0 | BA2 | BA0 | BA2 | BA0 | BA2 | BA0 | BA2 | BA0 | BA2 | BA0 | BA2 | BA0 | BA2 | BA0 | BA2 |
| BA1 | BA3 | BA1 | BA3 | BA1 | BA3 | BA1 | BA3 | BA1 | BA3 | BA1 | BA3 | BA1 | BA3 | BA1 | BA3 |

| Design for testability | | | | | | | | | Internal circuit function | | | | | | | | | | | | | | | |
|---|---|---|---|---|---|---|---|---|---|---|---|---|---|---|---|---|---|---|---|---|---|---|---|---|---|
| Enable signal | Control signal | | | | | | | | BG0 | | BG1 | | BG2 | | BG3 | | BG4 | | BG5 | | BG6 | | BG7 | |
| | <0> BG0 | <1> BG1 | <2> BG2 | <3> BG3 | <4> BG4 | <5> BG5 | <6> BG6 | <7> BG7 | BANK <1:0> | BANK <3:2> | BANK <1:0> | BANK <3:2> | BANK <1:0> | BANK <3:2> | BANK <1:0> | BANK <3:2> | BANK <1:0> | BANK <3:2> | BANK <1:0> | BANK <3:2> | BANK <1:0> | BANK <3:2> | BANK <1:0> | BANK <3:2> |
| 0 | x | x | x | x | x | x | x | x | v | v | v | v | v | v | v | v | v | v | v | v | v | v | v | v |
| 1 | 0 | 0 | 0 | 0 | 0 | 0 | 0 | 0 | v | - | v | - | v | - | v | - | v | - | v | - | v | - | v | - |
| 1 | 1 | | | | | | | | - | v | | | | | | | | | | | | | | |
| 1 | | 1 | | | | | | | | | - | v | | | | | | | | | | | | |
| 1 | | | 1 | | | | | | | | | | - | v | | | | | | | | | | |
| 1 | | | | 1 | | | | | | | | | | | - | v | | | | | | | | |
| 1 | | | | | 1 | | | | | | | | | | | | - | v | | | | | | |
| 1 | | | | | | 1 | | | | | | | | | | | | | - | v | | | | |
| 1 | | | | | | | 1 | | | | | | | | | | | | | | - | v | | |
| 1 | | | | | | | | 1 | | | | | | | | | | | | | | | - | v |

FIG. 5

ADDRESS DECODING CIRCUIT, MEMORY, AND CONTROL METHOD

CROSS-REFERENCE TO RELATED APPLICATION

This application claims priority to Chinese Patent Application No. 202210039196.X filed on Jan. 13, 2022, the disclosure of which is hereby incorporated by reference in its entirety.

BACKGROUND

With the wide usage of various memories, for example, a Dynamic Random Access Memory (referred to as DRAM) is very widely used. In practice, an address of a memory may fail due to some reasons, such as a process variation and a technical limitation.

In some implementations, a certain number of redundant addresses, such as redundant row addresses and column addresses, are reserved during design to replace failed addresses, thereby ensuring the normal operation of the memory. However, since the number of the redundant addresses is limited, when there are many failed addresses of the memory, the foregoing technology still cannot avoid a problem caused by the failed addresses, resulting in that the memory cannot normally work.

SUMMARY

The disclosure relates to a memory technology, and in particular to an address decoding circuit, a memory, and a control method.

Embodiments of the disclosure provide an address decoding circuit, a memory, and a control method.

According to some embodiments, a first aspect of the disclosure provides an address decoding circuit, including a plurality of decoding units each corresponding to a bank group. Each decoding unit includes a plurality of first NAND gates, an address selection signal outputted by each first NAND gate is configured to control a corresponding bank in the bank group corresponding to the decoding unit; a first input end of the first NAND gate is connected to an address signal of a bank corresponding to the first NAND gate; a second input end of the first NAND gate is connected to an output end of a second NAND gate or a third NAND gate; a first input end of the second NAND gate is connected to an enable signal, and a second input end of the second NAND gate is connected to a control signal; and a first input end of the third NAND gate is connected to the enable signal, and a second input end of the third NAND gate is connected to an inverted signal of the control signal.

According to some embodiments, a second aspect of the disclosure provides a memory, including: a plurality of bank groups and the address decoding circuit as stated above. Each bank of the bank groups is connected in one-to-one correspondence to an output end of each first NAND gate of a corresponding decoding unit in the address decoding circuit.

According to some embodiments, a third aspect of the disclosure provides a method for controlling address decoding, applied to the address decoding circuit as stated above. The method includes: responsive to switching of a memory to a capacity reduction mode, controlling an enable signal to be a first signal and setting a control signal, to enable some of banks of the memory; and responsive to switching of the memory to a normal mode, controlling the enable signal to be a second signal and setting the control signal, to enable all banks of the memory.

BRIEF DESCRIPTION OF THE DRAWINGS

The accompanying drawings, which are incorporated in and constitute a part of this specification, illustrate embodiments consistent with the disclosure and, together with the specification, serve to explain the principles of the disclosure.

FIG. 3A is a diagram of a storage structure of a memory according to an embodiment of the disclosure.

FIG. 4A is a diagram of a storage structure of a memory in a capacity reduction mode according to an embodiment of the disclosure.

FIG. 4B is a diagram of a storage structure of a memory in a capacity reduction mode according to an embodiment of the disclosure.

FIG. 4C is a diagram of a storage structure of a memory in a capacity reduction mode according to an embodiment of the disclosure.

FIG. 5 is a capacity reduction control mapping according to an embodiment of the disclosure.

Figure 1A:
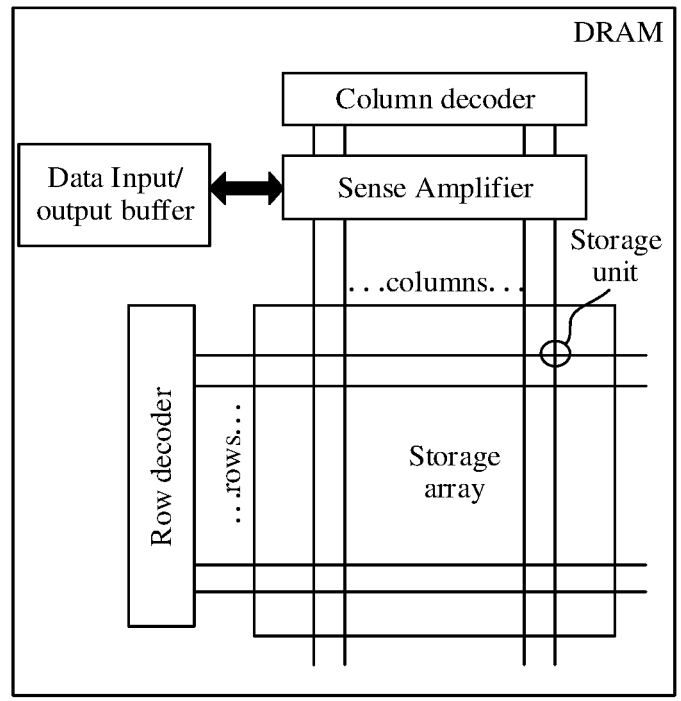
FIG. 1A is a schematic architecture diagram of a memory according to an embodiment of the disclosure.

The specific embodiments of the disclosure have been described through the described drawings, and more detailed descriptions for the embodiments will be made later. These drawings and text are not intended to limit the scope of the disclosure in any way, but to explain concepts of the disclosure to persons skilled in the art with reference to the specific embodiments.

DETAILED DESCRIPTION

Exemplary embodiments will be described here in detail, and examples thereof are represented in the accompanying drawings. When the following description relates to the accompanying drawings, unless otherwise indicated, the same numbers in different accompanying drawings represent the same or similar elements. Implementations described in the following exemplified embodiments do not represent all implementations consistent with the disclosure. On the contrary, they are only examples for apparatuses and methods consistent in same aspects of the disclosure as detailed in the attached claims.

The terms "comprise" and "have" in the disclosure are used to indicate open inclusion, and mean that additional elements/components, and the like may be presented in addition to the listed elements/components, etc. The terms "first", "second", and the like are used only as reference numerals, and are not limits to the number of corresponding objects. In addition, different elements and regions illustrated in the accompanying drawings are schematic, and therefore, the disclosure is not limited to the shown dimensions or distances in the accompanying drawings.

Specific embodiments are used below to describe the technical solutions of the disclosure in detail. The following several specific embodiments can be combined with each other, and a same or similar concept or process may not be described repeatedly in some embodiments. The embodiments of the disclosure are described below in conjunction with the accompanying drawings.

FIG. 1A is a schematic architecture diagram of a memory according to an embodiment of the disclosure. As shown in FIG. 1A, a DRAM is taken as an example, and includes a data input/output buffer, a row decoder, a column decoder, a sense amplifier, and a storage array. The storage array mainly consists of rows and columns. A storage unit of the storage array is provided at the intersection of a row and a bit line along a row direction of the array.

Figure 1B:
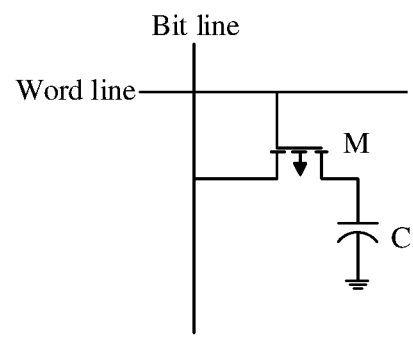
FIG. 1B is a schematic structural diagram of a storage unit according to an embodiment of the disclosure.

Each storage unit is configured to store data of one bit. As shown in FIG. 1B, FIG. 1B is a schematic structural diagram of a storage unit according to an embodiment of the disclosure. The storage unit mainly consists of a transistor switch M and a capacitor C. The capacitor is configured to store bit data, and the transistor switch is configured to perform turn-off or turn-on according to a selected state.

A storage unit may be activated by controlling the rows and the columns, so as to access the storage unit. A read scenario is taken as an example: when it is needed to read the bit data in the storage unit, the row (word line) where the storage unit is located may be selected by the row decoder, and correspondingly, the transistor switch M in the figure is turned on, and in this case, the state of the capacitor C can be sensed by sensing and amplifying a column (bit line) signal. For example, if the bit data stored in the storage unit is 1, 1 can be read from the bit line of the storage unit after the transistor switch M is turned on, and vice versa. In addition, a write scenario is taken as an example: when it is needed to write bit data into a storage unit, for example, 1 is written, the row (the word line) where the storage unit is located can be selected by the row decoder, and correspondingly, the transistor switch M in the figure is turned on, and the capacitor C is charged by setting the logic level of the column (the bit line) to be 1, i.e., writing 1 into the storage unit. Otherwise, if 0 is needed to be written, the logic level of the bit line is set to be 0, so that the capacitor C is discharged, i.e., writing 0 into the storage unit.

In practice, a plurality of storage arrays may constitute a bank (referred to as BA), and a plurality of banks may constitute a bank group (referred to as BG). For example, taking a Double Data Rate synchronous RAM (referred to as DDR) as an example, Table 1 and Table 2 are respectively address configurations for a 8 GB DDR and a 16 GB DDR shown by an embodiment of the disclosure.

TABLE 1

| | Configuration | 2 Gb × 4 | 1 Gb × 8 | 512 Mb × 16 |
|---|---|---|---|---|
| Bank Address | BG Address | BG0-BG2 | BG0-BG2 | BG0-BG1 |
| | Bank Address in a BG | BA0 | BA0 | BA0 |
| | # BG/# Banks per BG/# Banks | 8/2/16 | 8/2/16 | 4/2/8 |
| | Row Address | R0-R15 | R0-R15 | R0-R15 |
| | Column Address | C0-C10 | C0-C9 | C0-C9 |
| | Page size | 1 KB | 1 KB | 2 KB |

As shown in Table 1, Table 1 shows contents of a DDR JEDEC standard, and a first column thereof shows configuration of the 8 GB DDR, such as a bank address (Bank Address), specifically including a bank group addresses (BG Address), a bank address in a single bank group (Bank Address in a BG), and the number of the bank groups/the number of the banks in a single bank group/the total number of the banks (#BG/#Banks per BG/#Banks). The configuration further includes a row address, a column address, and a page size. For the specific function of the above configuration, a memory of 2 GB×4 is taken as an example. The memory of 2 GB×4 includes eight bank groups, the bank group address includes BG0-BG2; a single bank group consists of two banks, the bank address includes BA0; and there are sixteen banks, and the page size is 1 KB. A memory of 512 MB×16 is taken as an example. The memory of 512 MB×16 includes four bank groups, the bank group address includes BG0-BG1; a single bank group consists of two banks, the bank address includes BA0; and there are eight banks, and the page size is 2 KB.

TABLE 2

| | Configuration | 4 Gb × 4 | 2 Gb × 8 | 1 Gb × 16 |
|---|---|---|---|---|
| Bank Address | BG Address | BG0-BG2 | BG0-BG2 | BG0-BG1 |
| | Bank Address in a BG | BA0-BA1 | BA0-BA1 | BA0-BA1 |
| | # BG/# Banks per BG/# Banks | 8/4/32 | 8/4/32 | 4/4/16 |
| | Row Address | R0-R15 | R0-R15 | R0-R15 |
| | Column Address | C0-C10 | C0-C9 | C0-C9 |
| | Page size | 1 KB | 1 KB | 2 KB |

As shown in Table 2, a first column shows configuration of a 16 GB DDR. A memory of 4 GB×4 is taken as an example. The memory of 4 GB×4 includes eight bank groups, the bank group address includes BG0-BG2; a single bank group consists of four banks, the bank address includes BA0-BA1; and there are thirty-two banks, and the page size is 1 KB. A memory of 1 GB×16 is taken as an example. The memory of 1 GB×16 includes four bank groups, the bank group address includes BG0-BG1; a single bank group consists of four banks, the bank address includes BA0-BA1; and there are sixteen banks, and the page size is 2 KB.

It is to be understood that in some embodiments, the design of the memories having different capacities is different. In combination with the above example, the main difference of the address distribution of a 8 GB memory and a 16 GB memory is that the single bank group in the 8 GB memory consists of two banks, while the single bank group in the 16 GB memory consists of four banks. Some aspects of the embodiments of the disclosure relate to the flexible capacity reduction of the memory. A capacity reduction solution is introduced by way of example in combination with some embodiments of the disclosure.

Embodiment 1

Figure 2:
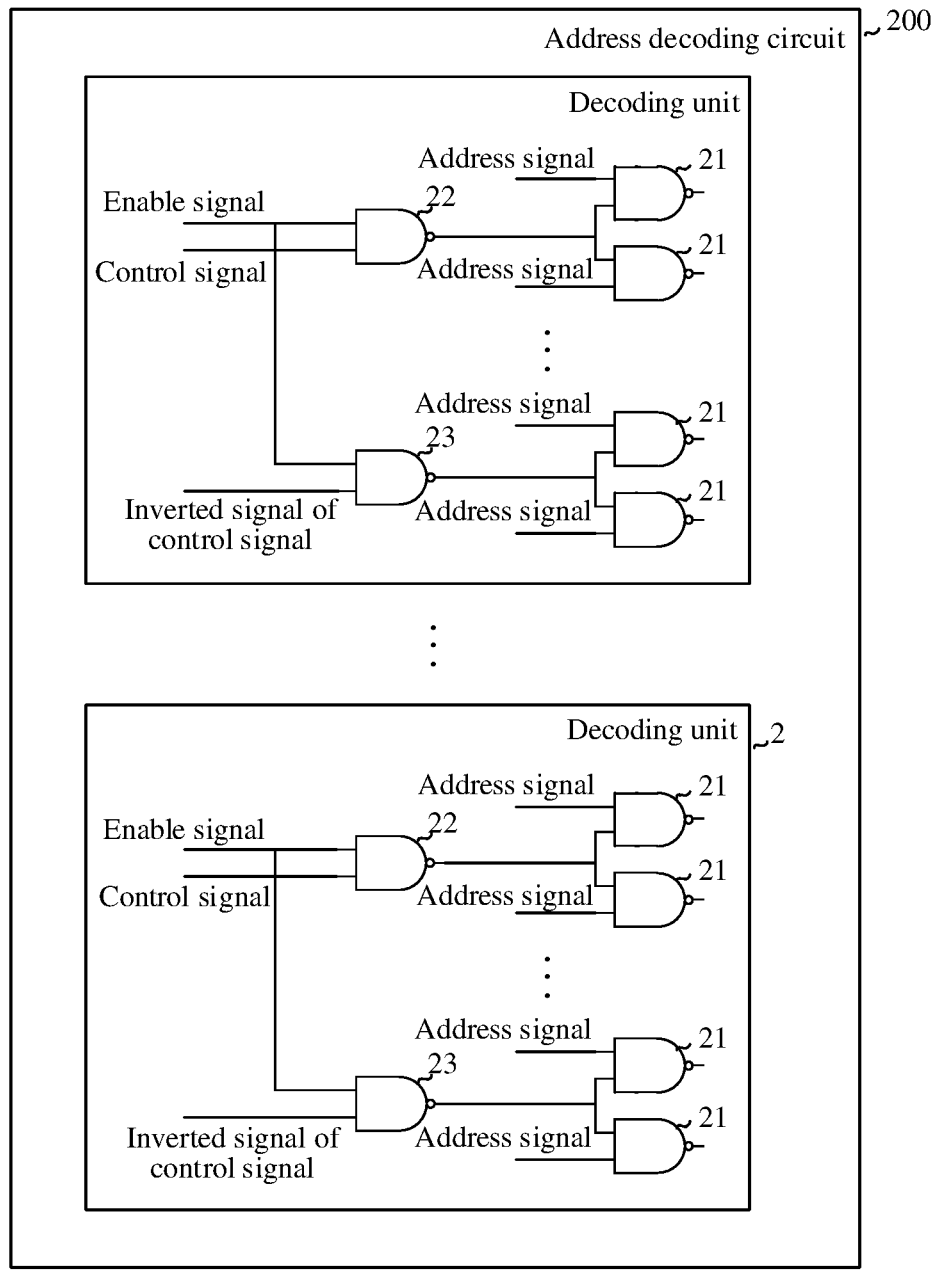
FIG. 2 is a schematic structural diagram of an address decoding circuit provided by an embodiment of the disclosure.

FIG. 2 is a schematic structural diagram of an address decoding circuit provided by an embodiment of the disclosure. The address decoding circuit provided by the embodiment is configured to achieve capacity reduction of a memory. As shown in FIG. 2, the address decoding circuit 200 includes a plurality of decoding units 2 corresponding to bank groups.

Each decoding unit 2 includes a plurality of first NAND gates 21, and an address selection signal outputted by each first NAND gate 21 is configured to control a corresponding bank in the bank group corresponding to the decoding unit. A first input end of the first NAND gate 21 is connected to an address signal of a corresponding bank of the first NAND gate, and a second input end of the first NAND gate 21 is connected to an output end of a second NAND gate 22 or a third NAND gate 23.

A first input end of the second NAND gate 22 is connected to an enable signal, and a second input end of the second NAND gate 22 is connected to a control signal. A first input end of the third NAND gate 23 is connected to the enable signal, and a second input end of the third NAND gate 23 is connected to an inverted signal of the control signal.

In practice, the address decoding circuit provided by the embodiment may be applied to various memories. As an example, the address decoding circuit can be applied to, but not limited to, a Double Data Rate synchronous DRAM (referred to as DDR DRAM) and the like.

Specifically, the first NAND gate has the first input end and the second input end. The first input end of the first NAND gate is connected to the address signal of the bank corresponding to the first NAND gate, and the second input end of the first NAND gate is connected to the output end of the second NAND gate or the third NAND gate. The address signal of the bank is configured to represent or determine a bank. As an example, the address signal of the bank may be determined based on the bank group where the bank is located and the address signal of the bank in the bank group.

In an example, a bank group corresponds to a decoding unit. For example, a bank group a corresponds to a decoding unit a, a bank group b corresponds to a decoding unit b, and so on. It should be noted that the numbers herein are merely intended to differentiate different bank groups or different decoding units, and do not limit specific correspondence between the bank groups and the decoding units, but only to ensure that each bank group corresponds to a decoding unit. In some embodiments, first NAND gates in the decoding unit each corresponds to a bank in the corresponding bank group.

Figure 3B:
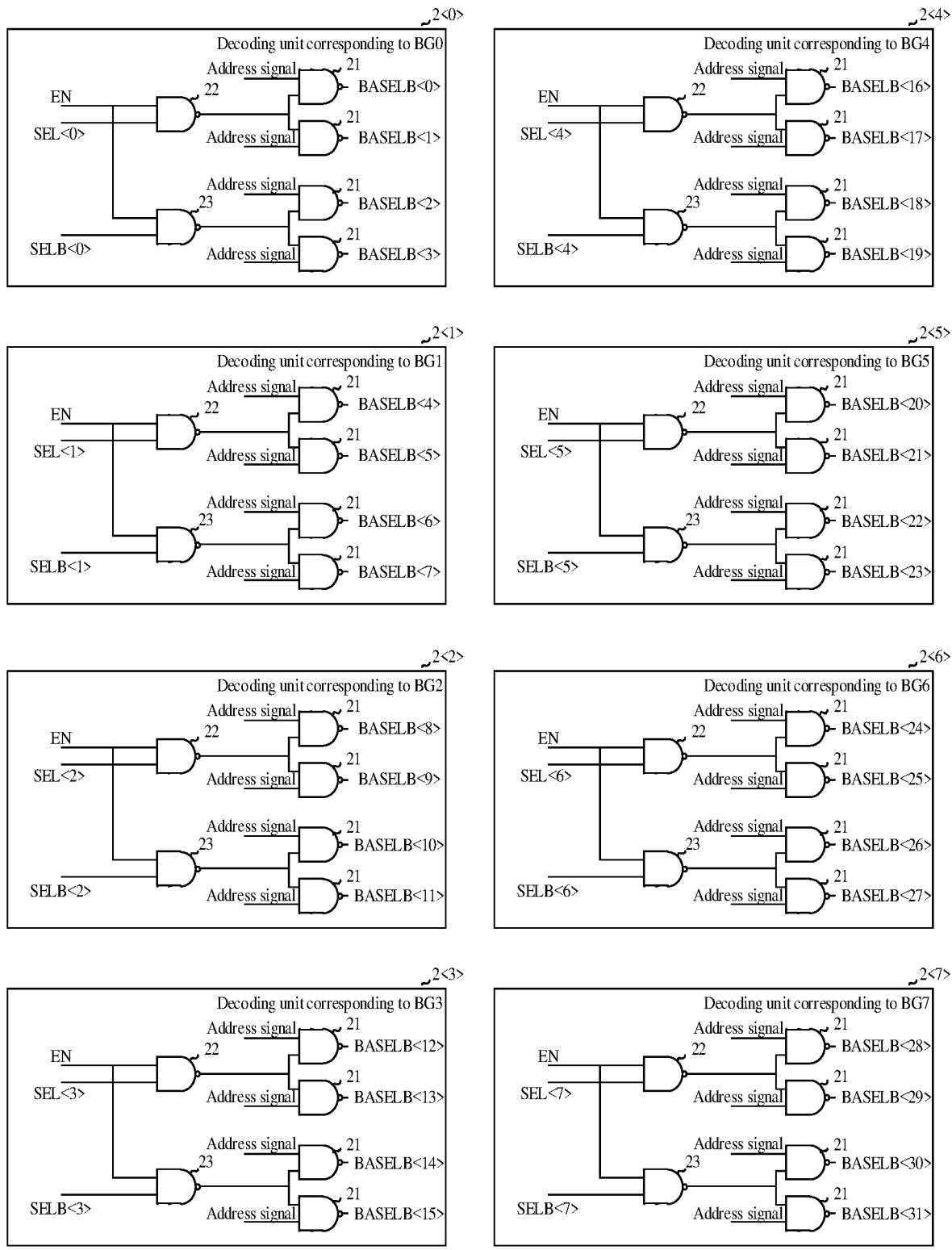
FIG. 3B is a schematic structural diagram of an address decoding circuit according to an embodiment of the disclosure.

For convenience of understanding, the memory is introduced by way of example. As shown in FIG. 3A, FIG. 3A is a diagram of a storage structure of a memory according to an embodiment of the disclosure. The memory includes eight bank groups BG0-BG7. Accordingly, in some embodiments, as shown in FIG. 3B, FIG. 3B is a schematic structural diagram of an address decoding circuit according to an embodiment of the disclosure. The address decoding circuit in the figure correspondingly includes eight decoding units 2<0>-2<7> that respectively correspond to the bank groups BG0-BG7. The decoding unit 2<0> corresponds to BG0, the decoding unit 2<1> corresponds to BG1, and so on.

As an example, in the memory shown in FIG. 3A, each bank group consists of four banks BA0-BA3. Accordingly, in some embodiments, as shown in FIG. 3B, each decoding unit includes fourth first NAND gates, and therefore, thirty-two first NAND gates are provided in the figure in total, respectively correspond to thirty-two banks in the bank groups BG0-BG7, and the address selection signals BASELB<0>-BASELB<31> of the corresponding banks are outputted.

With reference to FIG. 3A and FIG. 3B, in some embodiments, each bank group includes a first bank, a second bank, a third bank, and a fourth bank. Correspondingly, in the decoding unit, the second input end of the first NAND gate corresponding to the first bank and the second input end of the first NAND gate corresponding to the second bank are connected, and both are connected to the output end of the second NAND gate; and the second input end of the first NAND gate corresponding to the third bank and the second input end of the first NAND gate corresponding to the fourth bank are connected, and both are connected to the output end of the third NAND gate.

With reference to the structure shown in FIG. 3B, taking the decoding unit corresponding to the bank group BG0 as an example, the first bank is BA0, and the corresponding first NAND gate outputs a signal BASELB<0>; the second bank is BA1, and the corresponding first NAND gate outputs a signal BASELB<1>; the third bank is BA2, and the corresponding first NAND gate outputs a signal BASELB<2>; and the fourth bank is BA3, and the corresponding first NAND gate outputs a signal BASELB<3>. It should be noted that the above content in combination with FIG. 3B is merely an example. The terms "first", "second", and the like are merely used for differentiation, but do not indicate any specific structure.

Figure 3C:
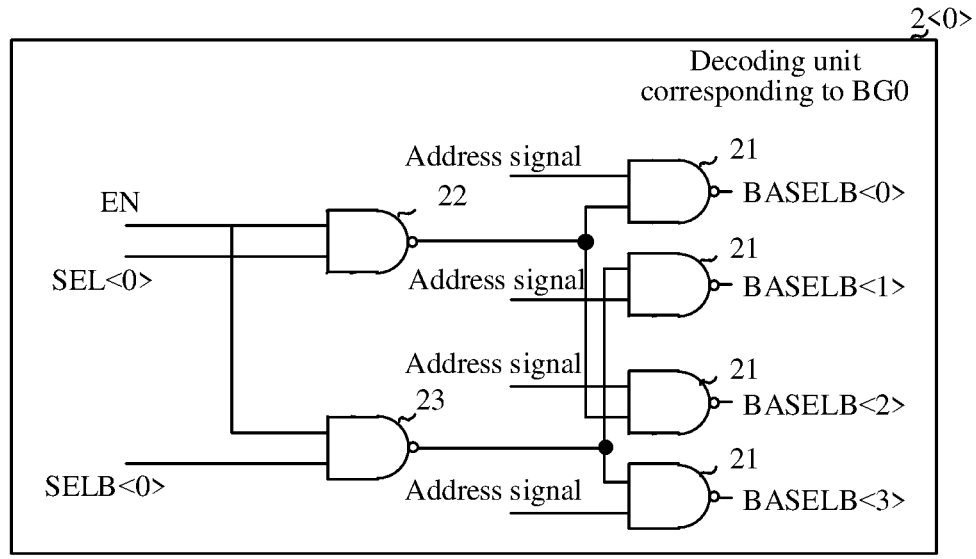
FIG. 3C is a schematic structural diagram of an address decoding circuit according to an embodiment of the disclosure.
Figure 3D:
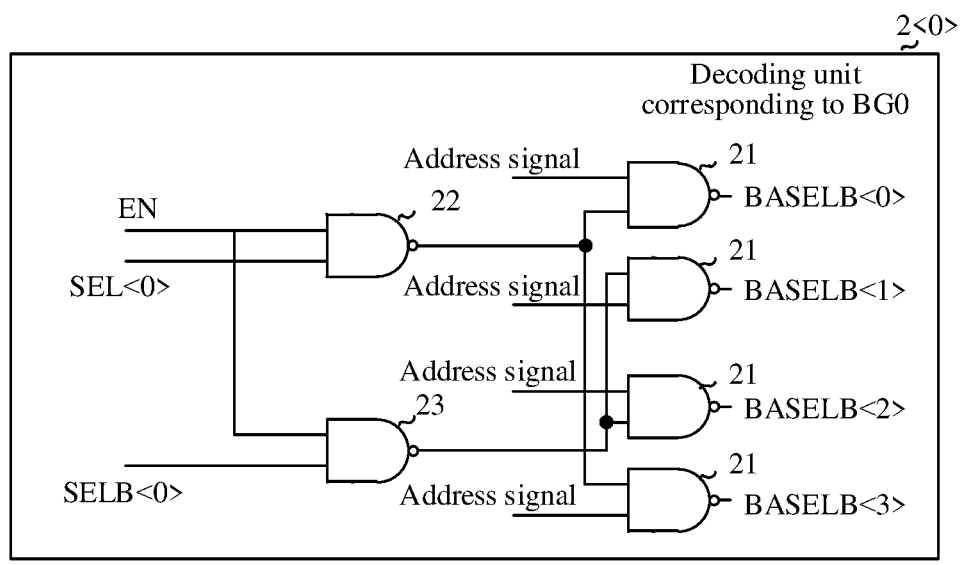
FIG. 3D is a schematic structural diagram of an address decoding circuit according to an embodiment of the disclosure.

In one example, as shown in FIG. 3C, taking the decoding unit 2<0> corresponding to the bank group BG0 as an example (the remaining structures are not shown), the second input end of the first NAND gate corresponding to BA0 (controlled by the signal BASELB<0>) and the second input end of the first NAND gate corresponding to BA2 (controlled by the signal BASELB<2>) may be connected, and both are connected to the output end of the second NAND gate 22; and the second input ends of the first NAND gates corresponding to the remaining two banks are connected, and both are connected to the output end of the third NAND gate 23. In another example, as shown in FIG. 3D, taking the decoding unit 2<0> corresponding to the bank group BG0 as an example (the remaining structures are not shown), the second input end of the first NAND gate corresponding to BA0 (controlled by the signal BASELB<0>) and the second input end of the first NAND gate corresponding to BA3 (controlled by the signal BASELB<3>) may be connected, and both are connected to the output end of the second NAND gate 22; and the second input ends of the first NAND gates corresponding to the remaining two banks are connected, and both are connected to the output end of the third NAND gate 23. It can be understood that in this example, only the following needs to be achieved that some banks are selected from the plurality of banks of each bank group and controlled by the control signal, and the remaining banks are controlled by the inverted signal of the control signal, and a specific correspondence can be adjusted and not limited.

In this embodiment, it is decided, according to the control signal, whether to enable or disable some banks of each bank group, and it is decided, according to the inverted signal of the control signal, whether to disable or enable the remaining banks. Therefore, a capacity reduction control policy is simplified, the integration level of the circuit is improved, and the size is reduced.

For better understanding, with reference to FIG. 3B, the working process of the address decoding circuit is introduced by way of example.

First, the enable signal (a signal EN in the figure) and the control signal (a signal SEL< . . . > in FIG. 3B, wherein < . . . > indicates an optional positive integer) are introduced. In this embodiment, when the enable signal EN is not activated, the memory is in a normal mode, i.e., all the banks are enabled; and when the enable signal EN is activated, the memory is in a capacity reduction mode, i.e., some banks can be disabled through the control signal SEL< . . . >, so as to achieve capacity reduction of the memory. The activation herein can be reflected as a level state of a signal. As an example, the enable signal EN can be defined as activation of a high level. When the enable signal EN is a high level signal, the memory enters the capacity reduction mode, and when the enable signal EN is a low level signal, the memory enters the normal mode.

With reference to FIG. 3B, taking the decoding unit corresponding to the bank group BG0 as an example, when the memory operates normally, the enable signal is 0, the control signal is failed, and the second NAND gate and the third NAND gate both output 1 in a fixed manner. Therefore, the address signal of the bank can be transmitted to the output end of the first NAND gate by means of the first NAND gate and then be outputted, thereby achieving addressing. That is, under the normal mode, all the banks of the memory are enabled, and the address decoding circuit can perform normal addressing and operation on each bank according to an inputted address signal.

Figures 4A, 4B, 4C:
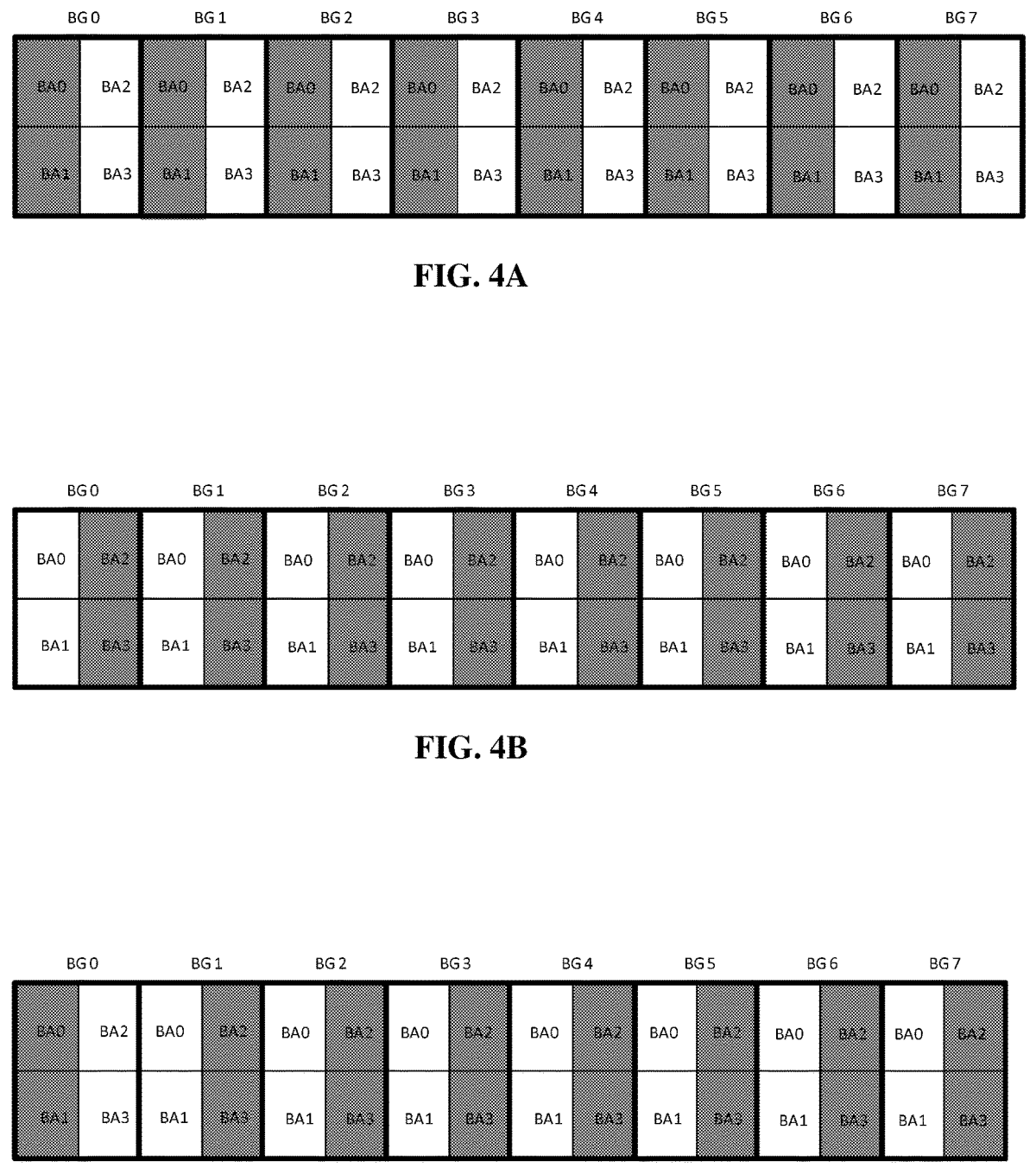

When the memory needs capacity reduction, for example, some addresses of the memory are failed, some banks may be disabled by means of capacity reduction, so as to ensure that the memory works normally under a reduced capacity. FIG. 3B is still taken as an example, when the memory needs capacity reduction, the enable signal EN is 1, and the control signal SEL< . . . > and the inverted signal SELB< . . . > of the control signal are respectively outputted by means of the second NAND gate 22 and the third NAND gate 23. On the basis of the exemplary structure shown in the figure, when the control signal SEL<0> is 1, the second NAND gate 22 in the decoding unit 2<0> outputs 0, the first NAND gates (front two first NAND gates 21 in the decoding unit 2<0>) corresponding to BA0 and BA1 output 1 in the fixed manner, the address signals of BA0 and BA1 are failed, and BA0 and BA1 are disabled. On the contrary, the inverted signal SELB<0> of the control signal is 0, and therefore, the third NAND gate 23 in the decoding unit 2<0> outputs 1, and the address signals of BA2 and BA3 can be outputted by means of the first NAND gates (next two first NAND gates 21 in the decoding unit 2<0>) corresponding to BA2 and BA3, thereby achieving normal addressing. On the basis of similar principles, as shown in FIG. 4A, FIG. 4A is a diagram of a storage structure of a memory in a capacity reduction mode according to an embodiment of the disclosure. On the basis of the memory shown in FIG. 3A and the working principle of the above example, when the enable signal is activated and the control signals of all the bank groups are 1, a gray bank is the bank that is disabled, and the remaining banks are the banks that are continued to be enabled. Similarity, as shown in FIG. 4B, when the enable signal is activated and the control signals of all the bank groups are 0, the enabling and disabling conditions of the banks are as shown in FIG. 4B.

In some embodiments, a plurality of bank groups share the same control signal, so as to simplify the circuit and capacity reduction control logic. Specifically, as shown in FIG. 4A or FIG. 4B, the rule that a bank in each bank group is disabled is identical.

In some embodiments, as shown in FIG. 3B, the control signals may have one-to-one correspondence with the bank groups. The second input ends of the second NAND gates 22 in the decoding units 2<0>-2<7> are connected to the control signals corresponding to the bank groups corresponding to the decoding units.

Specifically, the control signal is configured for each bank group in this embodiment. For each bank group, when the enable signal is activated, i.e., the memory is in the capacity reduction mode, flexible selection of the banks for capacity reduction can be achieved by programming the control signal of each bank group. FIG. 3B is still taken as an example, and the control signals SEL<0>-SEL<7> are correspondingly configured for the bank groups BG0-BG7. On the basis of the principle of the above working process, it is known that the disabling conditions of the banks in different bank groups may be different. As an example, FIG. 4C shows enabling and disabling conditions of the banks of the memory when the enable signals are activated and the control signal SEL<0> is 1 and control signals SEL<1>-SEL<7> all are 0.

In practice, the banks that need to be disabled or enabled may be flexibly selected by programming the control signals, thereby achieving flexible capacity reduction. Optionally, a programming means includes, but is not limited to, pre-storing firmware or providing a real-time programming interface. A 16G memory is taken as an example. As shown in FIG. 5, FIG. 5 is a capacity reduction control mapping according to an embodiment of the disclosure. In FIG. 5, "x" represents an arbitrary value, "v" represents being enabled, and "-" represents being disabled. In the example, each control signal corresponds to two banks in one bank group. When the control signal is activated, for example, the control signal is 1, the two banks, such as BANK<3:2>, in the bank group corresponding to the control signal are enabled, and the remaining two banks BANK<1:0> are disabled. On the basis of the control mapping relationship in the example, the flexible capacity reduction can be achieved according to a requirement. The disclosure is not limited to this example, and an enable state of the bank in the bank group controlled by the control signal further can be in any other form. For example, when the control signal is 1, the two banks, such as BANK<2:1>, in the bank group corresponding to the control signal are enabled, and the remaining two banks BANK<3:0> are disabled.

Figure 6:
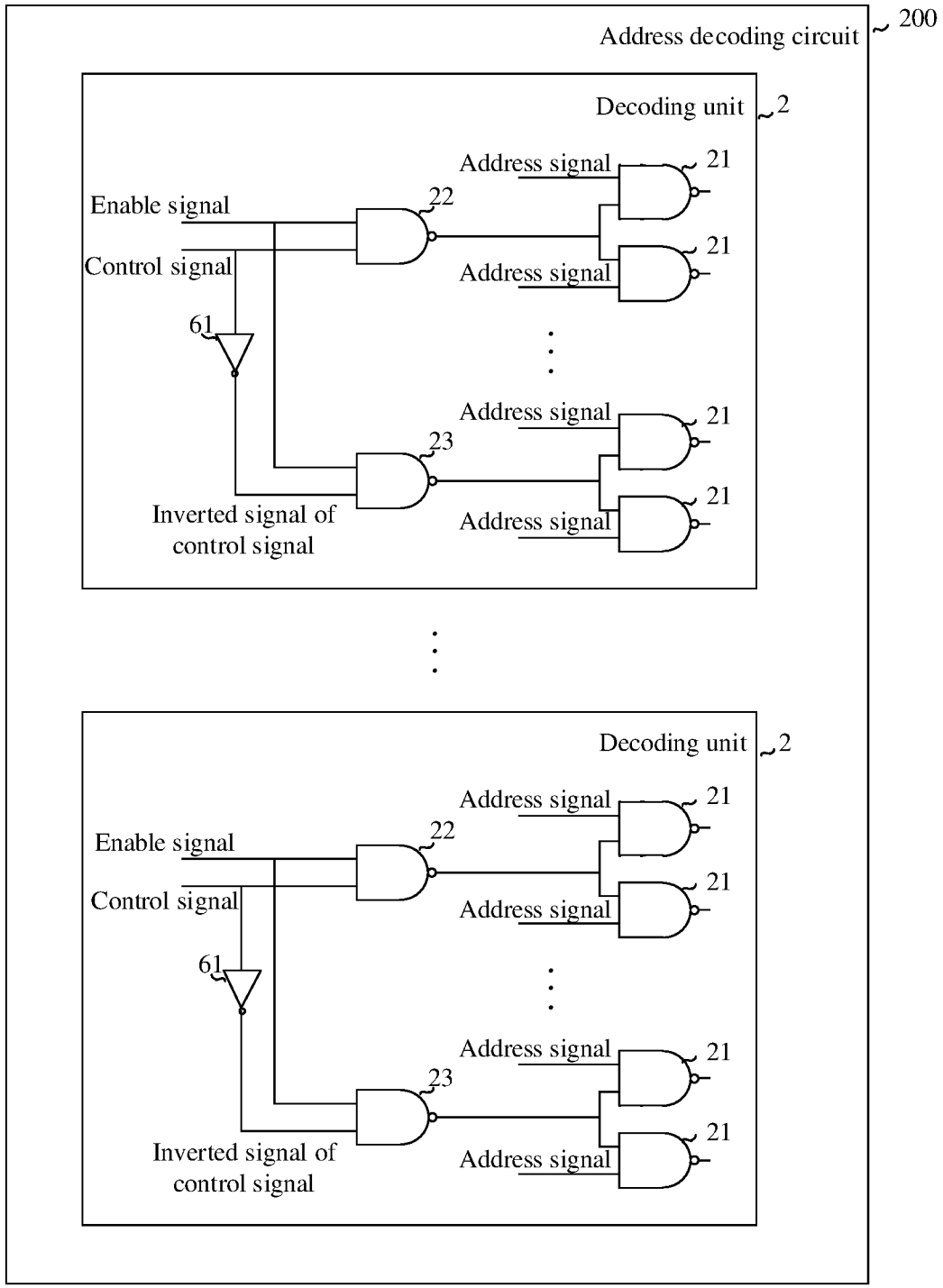
FIG. 6 is a schematic structural diagram of an address decoding circuit provided by an embodiment of the disclosure.

In some embodiments, as shown in FIG. 6, on the basis of other examples, in order to generate the inverted signal of the control signal, the decoding unit 21 further includes a first inverter 61. An input end of the first inverter 61 is connected to the control signal of the bank group corresponding to the decoding unit 21, and an output end of the first inverter 61 is connected to the second input end of the third NAND gate 23.

Figure 7:
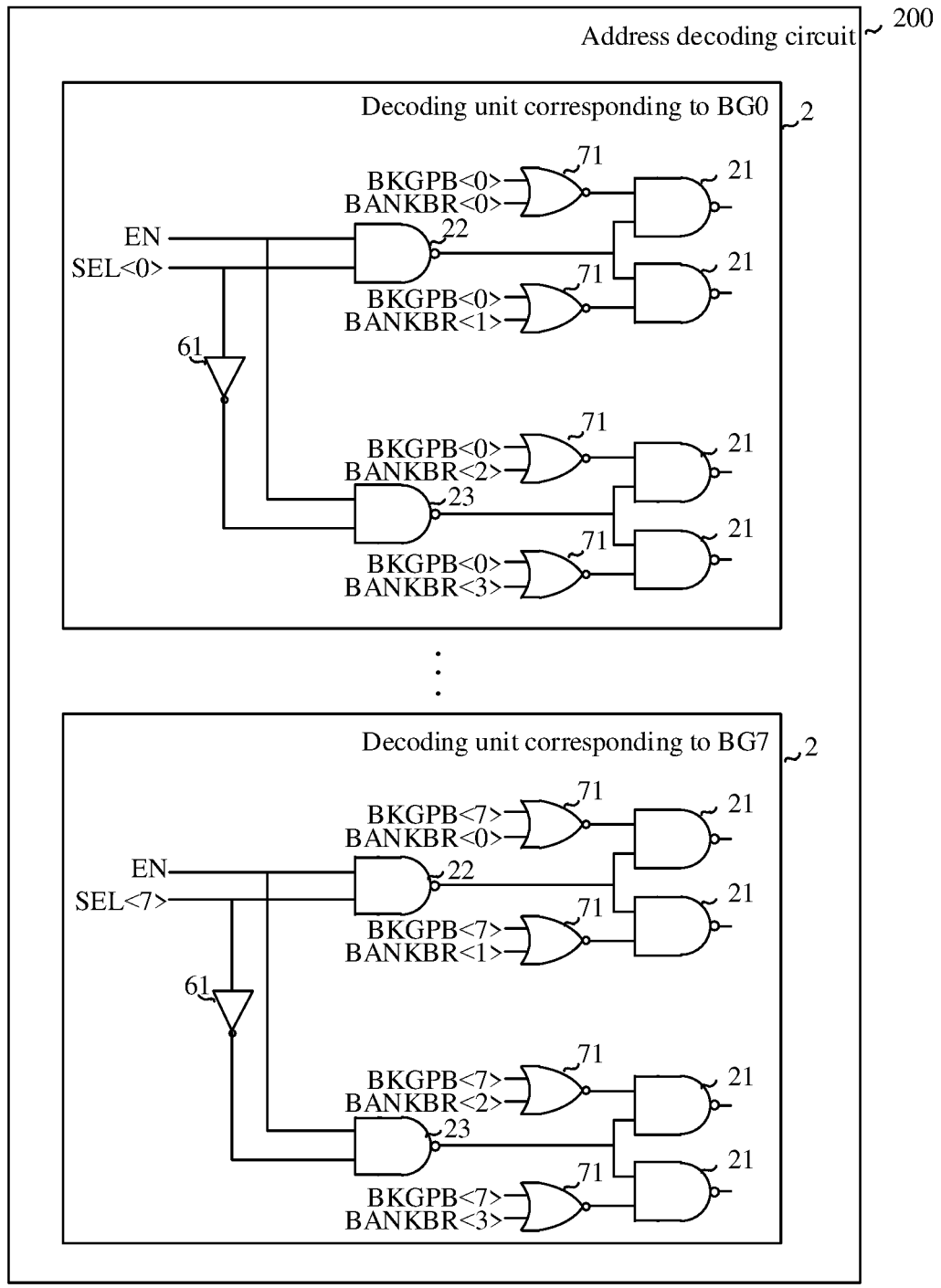
FIG. 7 is a schematic structural diagram of an address decoding circuit provided by an embodiment of the disclosure.

In order to generate a corresponding address signal of the bank, in some embodiments, FIG. 7 is a schematic structural diagram of an address decoding circuit provided by an embodiment of the disclosure. As shown in FIG. 7, the decoding unit 2 further includes a plurality of first NOR gates 71 having one-to-one correspondence with a plurality of banks in the bank group corresponding to the decoding unit 2.

A first input end of each first NOR gate 71 is connected to a group address signal of a corresponding bank.

A second input end of the first NOR gate 71 is connected to a block address signal of the corresponding bank.

An output end of the first NOR gate 71 is connected to the first input end of the corresponding first NAND gate 21 and is configured to output the address signal of the corresponding bank.

With reference to FIG. 7, taking the 16G memory as an example, BKGPB< . . . > represents the group address signal, and BANKBR< . . . > represents the block address signal. Specifically, BKGPB<0>-BKGPB<7> respectively correspond to the bank groups BG0-BG7 and are group address signals of the corresponding bank groups; and for each bank group, BANKBR<0>-BANKBR<3> respectively correspond to the banks BA0-BA3 in the bank group (it can be understood that each bank group includes fourth banks BA0-BA3, and thus, eight bank groups have thirty-two banks in total) and are the block address signals of the corresponding banks. It can be understood that in order to achieve addressing of a certain bank, in a possible addressing policy, the bank may be determined according to the bank group where the bank is located and the order of the bank in the bank group, thereby achieving addressing. Therefore, in this embodiment, the address signal representing the bank is outputted by means of NOR gate logic according to the group address signal of the bank (i.e., representing the bank group where the bank is located) and the block address signal of the bank (i.e., representing the location of the bank in the bank group). The outputted address signal is used as an input of the first NAND gate in the decoding unit. The first NAND gate selects, according to the states of the enable signal and the control signal, to output or not to output the address signal, and the corresponding bank is in an enable state or a disable state. The output herein means outputting a signal capable of reflecting a state of the address signal, and it is only required that the signal outputted by the first NAND gate can vary depending on different states of the address signal, but does not limit that the two signals must be the same signal.

Specifically, when the bank is disabled, the first NAND gate does not output the received address signal of the bank; otherwise, when the bank is enabled, the first NAND gate outputs the received address signal of the bank. In a practical application, an activation level of the address signal may be set, such as, the address signal is set to be active at a high level, i.e., when the address signal is 1, it indicates that the corresponding bank is selected. Accordingly, the corresponding address selection signal BASELB of the bank outputted by the first NAND gate is a low level signal, indicating that the bank is selected. For the bank that is in the enable state but is not selected, the first NAND gate correspondingly outputs the BASELB signal at a high level.

It should be noted that on the basis of the above example, the address selection signal of the bank outputted by the first NAND gate corresponding to the disabled bank may also be a high level signal. Specifically, although for the disabled bank and the bank that is enabled but not selected, the states of the corresponding address selection signals may be identical in some design, it is needed to be differentiated that for the enabled bank, the first NAND gate normally outputs a BASELB signal reflecting the address signal, but for the disabled bank, the first NAND gate outputs a fixed level but not the BASELB signal reflecting the address signal.

Figure 8:
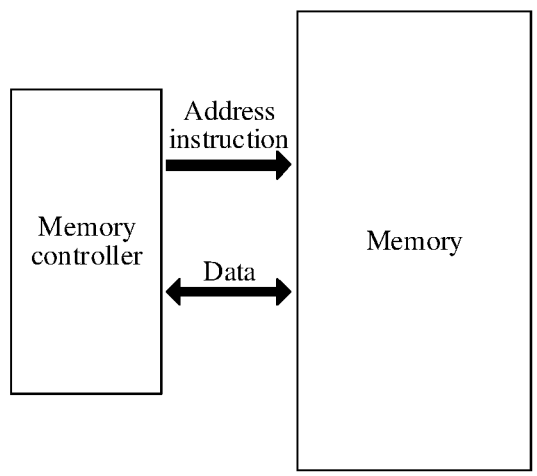
FIG. 8 is a schematic diagram of an application scenario of a memory.

In a practical application, as shown in FIG. 8, FIG. 8 is a schematic diagram of an application scenario of a memory. The scenario includes a memory controller and a memory. Specifically, the memory controller transmits data and an instruction by pins of the memory, and the memory performs corresponding processing, such as reading or writing. Therefore, in some embodiments, the memory can receive, by means of the pins, an address instruction inputted from the outside, and achieves addressing on the basis of the address decoding circuit provided by the embodiment.

Figure 9:
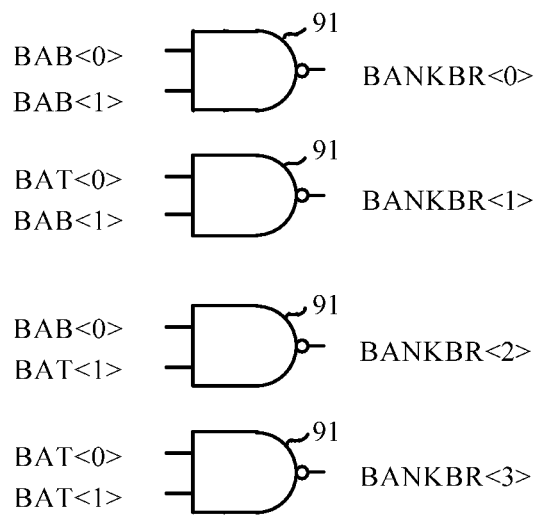
FIG. 9 is a schematic structural diagram of an address decoding circuit provided by an embodiment of the disclosure.

In order to obtain the block address signal, in some examples, as shown in FIG. 9, FIG. 9 is a schematic structural diagram of an address decoding circuit provided by an embodiment of the disclosure. On the basis of the other examples, the address decoding circuit further includes a plurality of fourth NAND gates 91. An output end of each fourth NAND gate 91 outputs a corresponding block address signal.

Input ends of different fourth NAND gates 91 are connected to different first signal combinations, and the different first signal combinations are obtained by combining block address input signals and inverted signals of the block address input signals.

The output end of each fourth NAND gate 91 is connected to the first input end of the first NOR gate 71 corresponding to the same bank as the fourth NAND gate 91 and is configured to output the block address signal of the bank.

With reference to the above scenario example, it can be understood that one bank may be determined according to the group address signal BKGPB< . . . > and the block address signal BANKBR< . . . >, and therefore, the block address signal corresponding to each bank in a single bank group may be set. Taking the 16G memory as an example, each bank group includes four banks, and four fourth NAND gates may be configured and respectively correspond to four banks in a single bank group, and output the block address signals BANKBR<0>-BANKBR<3> of each bank. The input ends of different fourth NAND gates are connected to different signal combinations, and the signal combinations are obtained by combining block address input signals BAT< . . . > and inverted signals BAB< . . . > of the block address input signals.

Figure 10:
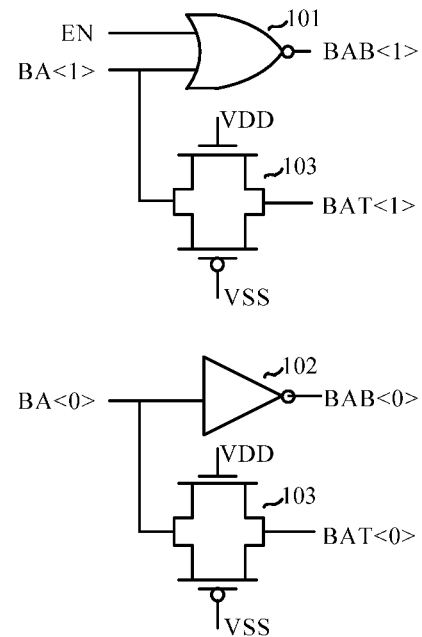
FIG. 10 is a schematic structural diagram of an address decoding circuit provided by an embodiment of the disclosure.

In a practical application, the block address input signal BAT< . . . > may be obtained by the memory through transmitting, by means of a transmission gate, the address input signal BAT< . . . > received by a pin. In one example, as shown in FIG. 10, the address decoding circuit further includes a second NOR gate 101, second inverters 102, and first transmission gates 103.

The first transmission gates 103 have one-to-one correspondence with the block address input signals. An input end of each first transmission gate 103 is connected to a corresponding block address input signal, and an output end of the first transmission gate is configured to output the block address input signal.

At least one block address input signal is connected to a first input end of the second NOR gate 101, and a second input end of the second NOR gate 101 is connected to the enable signal. An output end of the second NOR gate 101 is configured to output the inverted signal of the block address input signal when the enable signal is not activated, and output a fixed signal when the enable signal is activated.

The second inverters 102 have one-to-one correspondence with the remaining block address input signals. An input end of each second inverter 102 is connected to a corresponding block address input signal, and an output end of the second inverter 102 is configured to output the inverted signal of the block address input signal.

With reference to a scenario example, taking a 16G memory as an example, the memory receives an address instruction by means of the pin, and the address instruction includes block address input signals BA<0>-BA<1>. The block address input signals BA<0>-BA<1> are outputted by the corresponding first transmission gates as BAT<0>-BAT<1>. In the received block address input signals BA<0>-BA<1>, at least one block address input signal, such as BA<1>, is connected to the second NOR gate 101 as an input, and another input of the second NOR gate 101 is the enable signal EN. It can be understood that when the enable signal is not activated and is assumed to be 0, and the memory works normally, the second NOR gate outputs the inverted signal BAB<1> of BA<1> (or BAT<1>). When the enable signal is activated and is assumed to 1, and the memory is in a capacity reduction mode, because the enable signal input to the second NOR gate is 1, the second NOR gate outputs a fixed signal 0, regardless of the state of BA<1> received by the memory.

For the remaining block address input signals, such as BA<0>, the block address input signal BA<0> is connected to the second inverter 102 as an input, and the second inverter 102 correspondingly outputs the inverted signal BAB<0> of BA<0> (or BAT<0>), thereby obtaining the block address input signals BAT<0>-BAT<1> and the inverted signals BAB<0>-BAB<1 thereof. Further, these block address input signals and the inverted signals are used as the inputs of the fourth NAND gates through different combinations.

In one example, as shown in FIG. 10, the transmission gate may consist of two transistors that are correspondingly connected.

Mapping between different first signal combinations and different banks in a single bank group may be determined based on an input mapping. In one example, as shown in FIG. 9, one bank group includes four banks, and the block address input signals include a first block address input signal BAT<0> and a second block address input signal BAT<1>.

The first input end of the fourth NAND gate 91 corresponding to the first bank in the bank group is connected to the inverted signal BAB<0> of the first block address input signal, and the second input end is connected to the inverted signal BAB<1> of the second block address input signal.

The first input end of the fourth NAND gate corresponding to the second bank in the bank group is connected to the first block address input signal BAT<0>, and the second input end is connected to the inverted signal BAB<1> of the second block address input signal.

The first input end of the fourth NAND gate corresponding to the third bank in the bank group is connected to the inverted signal BAB<0> of the first block address input signal, and the second input end is connected to the second block address input signal BAT<1>.

The first input end of the fourth NAND gate corresponding to the fourth bank in the bank group is connected to the first block address input signal BAT<0>, and the second input end is connected to the second block address input signal BAT<1>.

The 16G memory is still taken as an example, four different first signal combinations are obtained from different combinations of the block address input signals BAT<0>-BAT<1> and the inverted signals BAB<0>-BAB<1> thereof, and respectively correspond to four banks in a single bank group. That is, the combination of BAB<0> and BAB<1> corresponds to the block address signal BANKBR<0> corresponding to the first bank in the single bank group; the combination of BAT<0> and BAB<1> corresponds to the block address signal BANKBR<1> corresponding to the second bank in the single bank group; the combination of BAB<0> and BAT<1> corresponds to the block address signal BANKBR<2> corresponding to the third bank in the single bank group; and the combination of BAT<0> and BAT<1> corresponds to the block address signal BANKBR<3> corresponding to the fourth bank in the single bank group. A logic operation is performed on different first signal combinations by the aforementioned fourth NAND gates, so as to output the block address signals corresponding to different combinations, i.e., the block address signals corresponding to different banks in each bank group.

As an example, the decoding units corresponding to different bank groups may share the block address signal BANKBR< . . . >. That is to say, each block address signal may be connected to the first NOR gates of different bank groups. With reference to the example of FIG. 7, as shown in the figure, the block address signals received by the first NOR gates 71 in each bank group all are BANKBR<0>-BANKBR<3>. This is because, as stated above, each bank can be determined according to the bank group where the bank is located and the location of the bank in the bank group.

Generally, when the block address signals are inputted into the decoding unit corresponding to the bank group BG0, the block address signals BANKBR<0>-BANKBR<3> respectively correspond to four banks BA0-BA3 in the bank group BG0 under the cooperation of the group address signal BKGPB<0>; when the block address signals are inputted into the decoding unit corresponding to the bank group BG1, the block address signals BANKBR<0>-BANKBR<3> respectively correspond to fourth banks BA4-BA7 in the bank group BG1 under the cooperation of the group address signal BKGPB<1>; and so on. It can be understood that although the decoding units corresponding to different bank groups receive the same block address signals BANKBR<0>-BANKBR<3>, one bank still can be accurately addressed under the cooperation of the group address signal.

Figure 11:
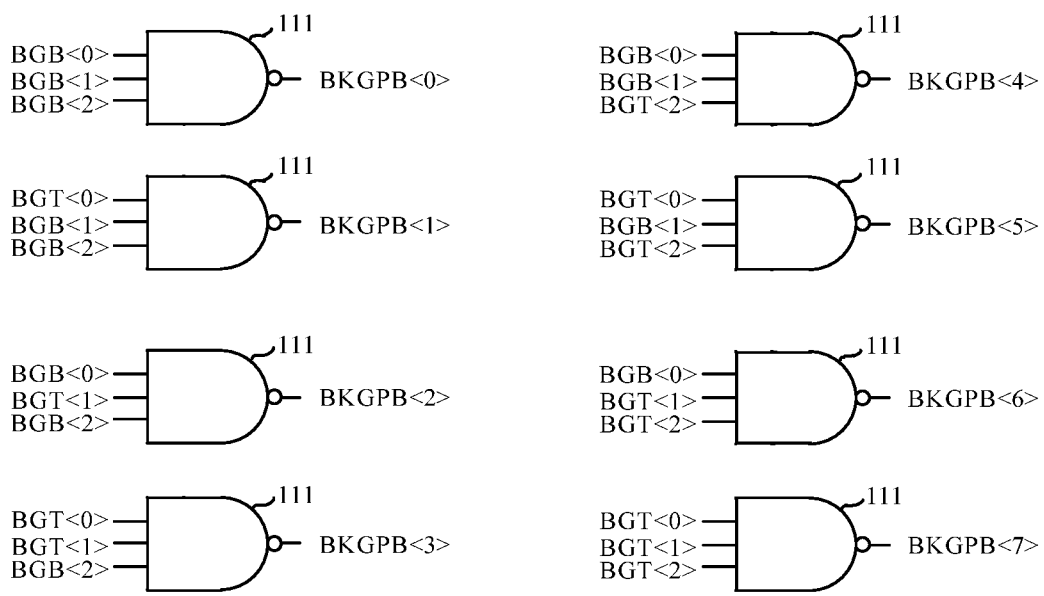
FIG. 11 is a schematic structural diagram of an address decoding circuit provided by an embodiment of the disclosure.

In addition, in order to obtain the group address signal, in some examples, as shown in FIG. 11, FIG. 11 is a schematic structural diagram of an address decoding circuit provided by an embodiment of the disclosure, and on the basis of the other examples, the address decoding circuit further includes a plurality of fifth NAND gates 111 having one-to-one correspondence with the bank groups.

The input ends of different fifth NAND gates 111 are connected to different second signal combinations, and the different second signal combinations are obtained by combining group address input signals and inverted signals of the group address input signals.

The output end of each fifth NAND gate 111 is connected to the second input end of the first NOR gate 71 corresponding to the same bank as the fifth NAND gate 111 and is configured to output the group address signal of the bank.

With reference to the above scenario example, it can be understood that one bank may be determined according to the group address signal BKGPB< . . . > and the block address signal BANKBR< . . . >, and therefore, the group address signals corresponding to different bank groups need to be generated. Taking the 16G memory as an example, the memory includes eight bank groups, and eight fifth NAND gates are configured and respectively correspond to the eight bank groups, and output the group address signals BKGPB<0>~BKGPB<7> of respective bank groups. The input ends of different fifth NAND gates are connected to different second signal combinations, and the different second signal combinations are obtained by combining group address input signals BGT< . . . > and inverted signals BGB< . . . > of the group address input signals.

Figure 12:
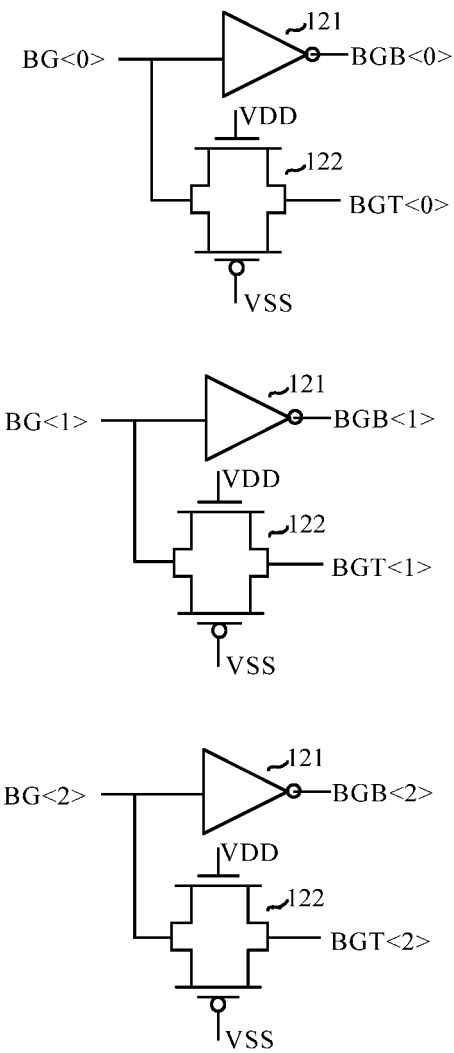
FIG. 12 is a schematic structural diagrams of an address decoding circuit provided by an embodiment of the disclosure

In a practical application, the group address input signal BGT< . . . > may be obtained by the memory through transmitting, by means of a transmission gate, the group address input signal BG< . . . > received by a pin. In one example, as shown in FIG. 12, the address decoding circuit further includes third inverters 121 and second transmission gates 122.

The second transmission gates 122 have one-to-one correspondence with the group address input signals. An input end of each second transmission gate 122 is connected to a corresponding group address input signal, and an output end of the second transmission gate 122 is configured to output the group address input signal.

The third inverters 121 have one-to-one correspondence with the group address input signals. An input end of each third inverter 121 is connected to a corresponding group address input signal, and an output end of the third inverter 121 is configured to output the inverted signal of the group address input signal.

With reference to a scenario example, taking a 16G memory as an example, the memory receives the address instruction by means of the pin, and the address instruction includes group address input signals BG<0>-BG<2>. The group address input signals BG<0>-BG<2> are outputted by means of the corresponding first transmission gates as BGT<0>-BGT<2>. The received group address input signals BG<0>-BG<2> are connected to respective third inverters 121 as inputs of the respective third inverters, and the third inverters 121 correspondingly output inverted signals BGB<0>-BGB<2>, thereby obtaining the group address input signals BGT<0>-BGT<2> and the inverted signals BGB<0>-BGB<2> thereof. Further, the group address input signals and inverted signals are used as the inputs of the fifth NAND gates through different combinations.

Mapping between different second signal combinations and different bank groups may be determined based on an input mapping. In one example, as shown in FIG. 11, there are eight bank groups, and the group address input signals include a first group address input signal BGT<0>, a second group address input signal BGT<1>, and a third group address input signal BGT<2>.

A first input end of a fifth NAND gate corresponding to the first bank group is connected to an inverted signal BGB<0> of the first group address input signal, a second input end is connected to an inverted signal BGB<1> of the second group address input signal, and a third input end is connected to an inverted signal BGB<2> of the third group address input signal.

A first input end of a fifth NAND gate corresponding to the second bank group is connected to the first group address input signal BGT<0>, a second input end is connected to the inverted signal BGB<1> of the second group address input signal, and a third input end is connected to the inverted signal BGB<2> of the third group address input signal.

A first input end of a fifth NAND gate corresponding to the third bank group is connected to the inverted signal BGB<0> of the first group address input signal, a second input end is connected to the second group address input signal BGT<1>, and a third input end is connected to the inverted signal BGB<2> of the third group address input signal.

A first input end of a fifth NAND gate corresponding to the fourth bank group is connected to the first group address input signal BGT<0>, a second input end is connected to the second group address input signal BGT<1>, and a third input end is connected to the inverted signal BGB<2> of the third group address input signal.

A first input end of a fifth NAND gate corresponding to the fifth bank group is connected to the inverted signal BGB<0> of the first group address input signal, a second input end is connected to the inverted signal BGB<1> of the second group address input signal, and a third input end is connected to the third group address input signal BGT<2>.

A first input end of a fifth NAND gate corresponding to the sixth bank group is connected to the first group address input signal BGT<0>, a second input end is connected to the inverted signal BGB<1> of the second group address input signal, and a third input end is connected to the third group address input signal BGT<2>.

A first input end of a fifth NAND gate corresponding to the seventh bank group is connected to the inverted signal BGB<0> of the first group address input signal, a second input end is connected to the second group address input signal BGT<1>, and a third input end is connected to the third group address input signal BGT<2>.

A first input end of a fifth NAND gate corresponding to the eighth bank group is connected to the first group address input signal BGT<0>, a second input end is connected to the second group address input signal BGT<1>, and a third input end is connected to the third group address input signal BGT<2>.

The 16G memory is still taken as an example, eight different second signal combinations are obtained from different combinations of the group address input signals BGT<0>-BGT<2> and the inverted signals BGB<0>-BGB<2> thereof, and respectively correspond to different bank groups. That is, the combination of BGB<0>, BGB<1>, and BGB<2> corresponds to the group address signal BKGPB<0> corresponding to the first bank group; the combination of BGT<0>, BAB<1>, and BGB<2> corresponds to the group address signal BKGPB<1> corresponding to the second bank group; the combination of BGB<0>, BGT<1>, and BGB<2> corresponds to the group address signal BKGPB<2> corresponding to the third bank group; the combination of BGT<0>, BGT<1>, and BGB<2> corresponds to the group address signal BKGPB<3> corresponding to the fourth bank group; the combination of BGB<0>, BGB<1>, and BGT<2> corresponds to the group address signal BKGPB<4> corresponding to the fifth bank group; the combination of BGT<0>, BGB<1>, and BGT<2> corresponds to the group address signal BKGPB<5> corresponding to the sixth bank group; the combination of BGB<0>, BGT<1>, and BGT<2> corresponds to the group address signal BKGPB<6> corresponding to the seventh bank group; and the combination of BGT<0>, BGT<1>, and BGT<2> corresponds to the group address signal BKGPB<7> corresponding to the eighth bank group. A logic operation is performed on different second signal combinations by the fifth NAND gates, so as to output the group address signals corresponding to different combinations, i.e., the group address signal corresponding to each bank group.

It should be explained that as an example, the block addresses corresponding to different banks in the same bank group may share the group address signal BKGPB< . . . >. That is to say, each group address signal may be connected to the first NOR gates in the corresponding bank group. With reference to an example of FIG. 7, as shown in FIG. 7, the group address signals received by the first NOR gates 71 in each bank group all are the group address signal corresponding to the bank group.

The address decoding circuit provided by the embodiments includes a decoding unit corresponding to a bank group. The decoding unit includes a logic unit configured for a corresponding bank. The logic unit receives the address signal of the bank, and enables some of the banks in the memory according to the enable signal and the control signal. When some addresses of the memory are failed, some of the banks of the memory can be flexibly enabled according to the solution of the disclosure. That is, flexible capacity reduction is performed on the memory, thereby avoiding the problem that the memory is disabled due to the address failure.

Embodiment 2

Figure 13:
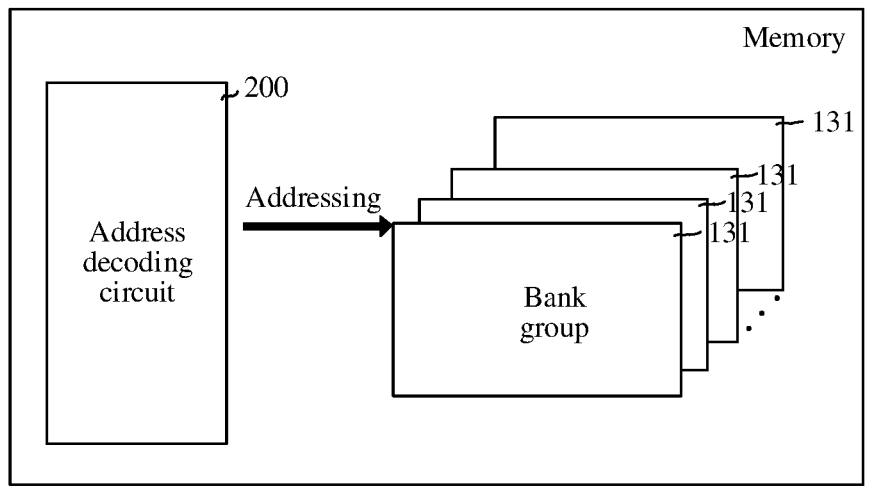
FIG. 13 is a schematic structural diagram of a memory provided by an embodiment of the disclosure.

FIG. 13 is a schematic structural diagram of a memory provided by an embodiment of the disclosure. As shown in FIG. 13, the memory includes a plurality of bank groups 131 and the address decoding circuit 200 illustrated by the above examples.

Each bank of the bank group 131 is connected in one-to-one correspondence to the output end of each first NAND gate (not shown in FIG. 13) of a corresponding decoding unit in the address decoding circuit 200.

The address decoding circuit 200 receives the address instruction, for example, the address instruction including, but not limited to, the group address input signal BG< . . . > and the block address input signal BA< . . . >. The address decoding circuit 200 generates two groups of signals according to the group address input signal BG< . . . > and the block address input signal BA< . . . >, one group including the group address input signals BGT< . . . > and the inverted signals BGB< . . . > thereof, and the other group including the block address input signals BAT< . . . > and the inverted signals BAB< . . . > thereof. For each group of signals, the group address signals BKGPB< . . . > corresponding to different bank groups and the block address signals BANKBR< . . . > corresponding to different banks in a single bank group are generated according to different signal combinations. One bank can be addressed based on the group address signals BKGPB< . . . > and the block address signals BANKBR< . . . >. It should be noted that FIG. 13 only shows an example.

A scenario where the memory normally works is taken as an example. When the memory works normally, the enable signal is not activated and all the banks are enabled, and normal addressing can be supported according to the above principle. Taking the memory in the capacity reduction mode as an example, when the memory is in the capacity reduction mode, the enable signal is activated, some of the banks are selected through the control signal to be disabled, these banks do not support to be addressed, and the remaining banks kept to be enabled may be normally addressed, thereby achieving flexible capacity reduction.

In the memory provided by this embodiment, the address decoding circuit includes the decoding unit corresponding to each bank group, the decoding unit includes a logic unit configured for a corresponding bank, and the logic unit receives the address signal of the bank, and enables some of the banks in the memory according to the enable signal and the control signal. When some addresses of the memory are failed, some of the banks of the memory can be disabled according to this solution of the disclosure. That is, flexible capacity reduction is performed on the memory, thereby avoiding the problem that the memory is disabled due to the address failure.

Embodiment 3

Figure 14:
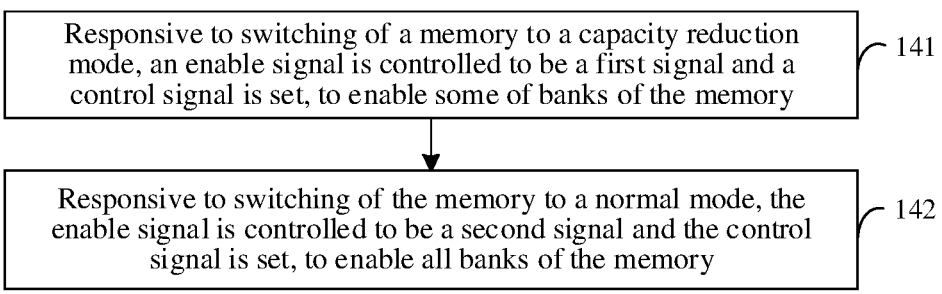
FIG. 14 is a schematic flowchart of a method for controlling address decoding provided by an embodiment of the disclosure.

FIG. 14 is a schematic flowchart of a method for controlling address decoding provided by an embodiment of the disclosure. The method for controlling address decoding is applied to the structure of any example of the abovementioned embodiments. The method includes the following steps.

In step 141, responsive to switching of a memory to a capacity reduction mode, an enable signal is controlled to be a first signal and a control signal is set, to enable some of banks of the memory.

In step 142, responsive to switching of the memory to a normal mode, the enable signal is controlled to be a second signal and the control signal is set, to enable all banks of the memory.

In a practical application, when the enable signal is the second signal, i.e., the enable signal is not activated, the control signal can be set arbitrarily, for example, the control signal is set to be a default signal. In one example, each bank group includes an even number of banks, and the method further includes: responsive to switching of the memory to the capacity reduction mode, controlling the enable signal to be the first signal and setting the control signal, to enable half of the banks of all bank groups of the memory.

In this embodiment, the address decoding circuit includes a decoding unit corresponding to a bank group, the decoding unit includes a logic unit configured for a corresponding bank, and the logic unit receives the address signal of the bank, and enables some of the banks in the memory according to the enable signal and the control signal. When some addresses of the memory are failed, the enable signal is controlled and the control signal is set according to the method for controlling address decoding, so as to disable some of the banks of the memory. That is, flexible capacity reduction is performed on the memory, thereby avoiding the problem that the memory is disabled due to the address failure.

After considering the specification and practicing the implementations of the present disclosure, a person skilled in the art may easily conceive of other implementations of this application. This application is intended to cover any variations, uses, or adaptive changes of this application. These variations, uses, or adaptive changes follow the general principles of this application and include common general knowledge or common technical means in the art, which are not disclosed in this application. The specification and embodiments are merely considered to be exemplary, and the actual scope and spirit of the disclosure are indicated in the following claims.

It is to be understood that this application is not limited to the precise structures described above and shown in the accompanying drawings, and various modifications and changes can be made without departing from the scope of this application. The scope of this application is subject only to the appended claims.

What is claimed is:

1. An address decoding circuit, comprising: a plurality of decoding unit each corresponding to a bank group, wherein each decoding unit comprises a plurality of first Negated AND (NAND) gates, an address selection signal outputted by each first NAND gate is configured to control a corresponding bank in the bank group corresponding to the decoding unit, and the first NAND gate includes a first input end connected to an address signal of a bank corresponding to the first NAND gate and a second input end connected to an output end of a second NAND gate or an output end of a third NAND gate;

the second NAND gate includes a first input end connected to an enable signal and a second input end connected to a control signal, and the third NAND gate includes a first input end connected to the enable signal and a second input end connected to an inverted signal of the control signal.

2. The address decoding circuit of claim 1, wherein control signals have one-to-one correspondence with bank groups; and the second input end of the second NAND gate in the decoding unit is connected to the control signal corresponding to the bank group corresponding to the decoding unit.

3. The address decoding circuit of claim 2, wherein the decoding unit further comprises a first inverter; and an input end of the first inverter is connected to the control signal of the bank group corresponding to the decoding unit, and an output end of the first inverter is connected to the second input end of the third NAND gate.

4. The address decoding circuit of claim 1, wherein each bank group comprises a first bank, a second bank, a third bank, and a fourth bank;

in the decoding unit, the second input end of the first NAND gate corresponding to the first bank and the second input end of the first NAND gate corresponding to the second bank are connected, and both are connected to an output end of the second NAND gate; and the second input end of the first NAND gate corresponding to the third bank and the second input end of the first NAND gate corresponding to the fourth bank are connected, and both are connected to the output end of the third NAND gate.

5. The address decoding circuit of claim 1, wherein the decoding unit further comprises a plurality of first NOR gates having one-to-one correspondence with a plurality of banks in the bank group corresponding to the decoding unit;

a first input end of each first NOR gate is connected to a group address signal of a corresponding bank;

a second input end of the first NOR gate is connected to a block address signal of the corresponding bank; and an output end of the first NOR gate is connected to a first input end of the corresponding first NAND gate and is configured to output the address signal of the corresponding bank.

6. The address decoding circuit of claim 5, further comprising: a plurality of fourth NAND gates, and an output end of each fourth NAND gate outputs a corresponding block address signal; wherein input ends of different fourth NAND gates are connected to different first signal combinations, and the different first signal combinations are obtained by combining block address input signals with inverted signals of the block address input signals; and an output end of each fourth NAND gate is connected to an first input end of a first NOR gate corresponding to a same bank and is configured to output the block address signal of the bank.

7. The address decoding circuit of claim 6, wherein one bank group comprises four banks, and the block address input signals comprise a first block address input signal and a second block address input signal;

a fourth NAND gate corresponding to a first bank in the bank group includes a first input end connected to an inverted signal of the first block address input signal and a second input end connected to an inverted signal of the second block address input signal;

a fourth NAND gate corresponding to a second bank in the bank group includes a first input end connected to the first block address input signal and a second input end connected to the inverted signal of the second block address input signal;

a fourth NAND gate corresponding to a third bank in the bank group includes a first input end connected to the inverted signal of the first block address input signal and a second input end connected to the second block address input signal; and a fourth NAND gate corresponding to a fourth bank in the bank group includes a first input end connected to the first block address input signal and a second input end connected to the second block address input signal.

8. The address decoding circuit of claim 6, further comprising a second NOR gate, second inverters, and first transmission gates; wherein the first transmission gates have one-to-one correspondence with the block address input signals, an input end of each first transmission gate is connected to a corresponding block address input signal, and an output end of the first transmission gate is configured to output the block address input signal;

at least one block address input signal is connected to a first input end of the second NOR gate, a second input end of the second NOR gate is connected to the enable signal, and an output end of the second NOR gate is configured to output the inverted signal of the block address input signal when the enable signal is not activated, and output a fixed signal when the enable signal is activated;

the second inverters have one-to-one correspondence with the remaining block address input signals, an input end of each second inverter is connected to a corresponding block address input signal, and an output end of the second inverter is configured to output the inverted signal of the block address input signal.

9. The address decoding circuit of claim 5, further comprising: a plurality of fifth NAND gates having one-to-one correspondence with the bank groups; wherein input ends of different fifth NAND gates are connected to different second signal combinations, and the different second signal combinations are obtained by combining group address input signals with inverted signals of the group address input signals; and an output end of each fifth NAND gate is connected to a second input end of a first NOR gate corresponding to a same bank and is configured to output the group address signal of the bank.

10. The address decoding circuit of claim 9, wherein there are eight bank groups, and the group address input signals comprise a first group address input signal, a second group address input signal, and a third group address input signal;

a fifth NAND gate corresponding to a first bank group includes a first input end connected to an inverted signal of the first group address input signal, a second input end connected to an inverted signal of the second group address input signal, and a third input end connected to an inverted signal of the third group address input signal;

a fifth NAND gate corresponding to a second bank group includes a first input end connected to the first group address input signal, a second input end connected to the inverted signal of the second group address input signal, and a third input end connected to the inverted signal of the third group address input signal;

a fifth NAND gate corresponding to a third bank group includes a first input end connected to the inverted signal of the first group address input signal, a second input end connected to the second group address input signal, and a third input end connected to the inverted signal of the third group address input signal;

a fifth NAND gate corresponding to a fourth bank group includes a first input end connected to the first group address input signal, a second input end connected to the second group address input signal, and a third input end connected to the inverted signal of the third group address input signal;

a fifth NAND gate corresponding to a fifth bank group includes a first input end connected to the inverted signal of the first group address input signal, a second input end connected to the inverted signal of the second group address input signal, and a third input end connected to the third group address input signal;

a fifth NAND gate corresponding to a sixth bank group includes a first input end connected to the first group address input signal, a second input end connected to the inverted signal of the second group address input signal, and a third input end connected to the third group address input signal;

a fifth NAND gate corresponding to a seventh bank group includes a first input end connected to the inverted signal of the first group address input signal, a second input end connected to the second group address input signal, and a third input end connected to the third group address input signal; and a fifth NAND gate corresponding to an eighth bank group includes a first input end connected to the first group address input signal, a second input end connected to the second group address input signal, and a third input end connected to the third group address input signal.

11. The address decoding circuit of claim 9, further comprising: third inverters and second transmission gates; wherein the second transmission gates have one-to-one correspondence with the group address input signals, an input end of each second transmission gate is connected to a corresponding group address input signal, and an output end of the second transmission gate is configured to output the group address input signal; and the third inverters have one-to-one correspondence with the group address input signals, an input end of each third inverter is connected to a corresponding group address input signal, and an output end of the third inverter is configured to output the inverted signal of the group address input signal.

12. A memory, comprising: a plurality of bank groups and the address decoding circuit of claim 1, wherein each bank of the bank groups is connected in one-to-one correspondence to an output end of each first NAND gate of a corresponding decoding unit in the address decoding circuit.

13. A method for controlling address decoding, applied to the address decoding circuit of claim 1, comprising:

responsive to switching of a memory to a capacity reduction mode, controlling an enable signal to be a first signal and setting a control signal, to enable part of banks of the memory; and responsive to switching of the memory to a normal mode, controlling the enable signal to be a second signal and setting the control signal, to enable all banks of the memory.

14. The method for controlling address decoding of claim 13, wherein each bank group comprises an even number of banks, and the method further comprises:

controlling, responsive to switching of the memory to the capacity reduction mode, the enable signal to be the first signal, and setting the control signal to enable half of the banks of all bank groups of the memory.

* * * * *